United States Patent
Chu et al.

(10) Patent No.: US 9,059,200 B1
(45) Date of Patent: Jun. 16, 2015

(54) III-NITRIDE METAL-INSULATOR-SEMICONDUCTOR FIELD-EFFECT TRANSISTOR

(71) Applicant: HRL LABORATORIES LLC, Malibu, CA (US)

(72) Inventors: Rongming Chu, Newbury Park, CA (US); David F. Brown, Woodland Hills, CA (US); Xu Chen, San Antonio, TX (US); Adam J. Williams, Santa Paula, CA (US); Karim S. Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/469,187

(22) Filed: Aug. 26, 2014

Related U.S. Application Data (62) Division of application No. 13/456,039, filed on Apr. 25, 2012, now Pat. No. 8,853,709.

(60) Provisional application No. 61/513,426, filed on Jul. 29, 2011.

(51) Int. Cl.
  *H01L 29/66* (2006.01)
  *H01L 29/205* (2006.01)
  *H01L 29/20* (2006.01)

(52) U.S. Cl.
  CPC ........ *H01L 29/66462* (2013.01); *H01L 29/205* (2013.01); *H01L 29/2003* (2013.01); *H01L 29/2006* (2013.01)

(58) Field of Classification Search
  CPC ............ H01L 29/7787; H01L 29/2003; H01L 29/66462; H01L 29/66431
  USPC ........ 257/76, 77, E29.253; 438/167, 172, 191
  See application file for complete search history.

(56) References Cited

U.S. PATENT DOCUMENTS

| | | | |
|---|---|---|---|
| 6,423,645 B1 * | 7/2002 | Wei et al. | ........ 438/738 |
| 7,555,219 B2 | 6/2009 | Cox et al. | |
| 2003/0020092 A1 | 1/2003 | Parikh et al. | |
| 2006/0011915 A1 | 1/2006 | Saito et al. | |

(Continued)

FOREIGN PATENT DOCUMENTS

| | | |
|---|---|---|
| JP | 2008-227501 | 9/2008 |
| WO | 2007/062589 | 6/2007 |

OTHER PUBLICATIONS

U.S. Appl. No. 12/909,497, filed Oct. 21, 2010, Burnham et al.

(Continued)

*Primary Examiner* — Tucker Wright
(74) *Attorney, Agent, or Firm* — Ladas & Parry (57) ABSTRACT

A field effect transistor (FET) includes a III-Nitride channel layer, a III-Nitride barrier layer on the channel layer, wherein the barrier layer has an energy bandgap greater than the channel layer, a source electrode electrically coupled to one of the III-Nitride layers, a drain electrode electrically coupled to one of the III-Nitride layers, a gate insulator layer stack for electrically insulating a gate electrode from the barrier layer and the channel layer, the gate insulator layer stack including an insulator layer, such as SiN, and an AlN layer, the gate electrode in a region between the source electrode and the drain electrode and in contact with the insulator layer, and wherein the AlN layer is in contact with one of the III-Nitride layers.

12 Claims, 6 Drawing Sheets

(56) References Cited

U.S. PATENT DOCUMENTS

| | | | |
|---|---|---|---|
| 2006/0060871 | A1 | 3/2006 | Beach |
| 2006/0194379 | A1 | 8/2006 | Suda et al. |
| 2007/0141823 | A1* | 6/2007 | Preble et al. ............. 438/604 |
| 2007/0210332 | A1 | 9/2007 | Ueno et al. |
| 2008/0237605 | A1 | 10/2008 | Murata et al. |
| 2008/0261378 | A1* | 10/2008 | Yao et al. ................. 438/458 |
| 2009/0146186 | A1 | 6/2009 | Kub et al. |
| 2009/0315078 | A1 | 12/2009 | Parikh et al. |
| 2010/0025730 | A1* | 2/2010 | Heikman et al. ............ 257/194 |
| 2010/0155780 | A1 | 6/2010 | Machida et al. |
| 2012/0235160 | A1 | 9/2012 | Heikman et al. |
| 2012/0261720 | A1 | 10/2012 | Puglisi et al. |
| 2013/0026495 | A1 | 1/2013 | Chu et al. |
| 2013/0181224 | A1 | 7/2013 | Lim et al. |

OTHER PUBLICATIONS

T. Hashizume, E. Alekseev, D. Pavlidis, K. Boutros, and J. Redwing, "Capacitance-Voltage Characterization of Aln/GaN Metal-Insulator-Semiconductor Structures Grown on Sapphire Substrate by Metalorganic Chemical Vapor Deposition,"Journal of Applied Physics, vol. 88, No. 4, pp. 1983-1986, Aug. 2000.

T. Chen, G. Jiao, Z. Li, K. Shao, and N. Yang, "AlGaN/GaN MIS HEMT with ALD Dielectric,"Digest of CS MANTECh Conference, pp. 227-230, Apr. 2006.

S.D. Burnham, K. Boutros, P. Hashimoto, C. Butler, D.W.S. Wong, M. Hu, and M. Micovic, "Gate-recessed Normally-off GaN-on-Si HEMT using a new O2/BCl3 Digital Etching Technique," at ICNS-8 Jeju, Korea, 2009.

Ambacher, et al., "Two-Dimensional electron gasses induced by spontaneous and piezoelectric polarization charges in N- and Ga-face AlGaN/GaN heterostructures", Journal of Applied Physics, vol. 85 No. 6, p. 3222-32333, Mar. 15, 1999.

Buttari, et al., "Origin of etch delay time C12 dry etching of AlGaN/GaN structures", Appl. Phys. Lett. vol. 83 No. 23, p. 4779-4781, Dec. 8, 2003.

Cai, et al. "High-Performance Enhancement-Mode AlGaN/GaN HEMTs Using Flouride-Based Plasma Treatment", IEEE Electron Device Letters vol. 26, No. 7, p. 435-437, Jul. 2005.

Kahn, et al., "Enhancement and depletion mode GaN/AlGaN heterostructure field effect", Appl. Phys. Lett., vol. 68, No. 4, p. 514-516, Jan. 1996.

Ludviksson, et al., "Atomic layer etching chemistry of C12 on GaAs (100)", Surface Science 277, p. 282-300, (1992).

Moon et al., "Submicron Enhancement-mode AlGaN/GaN HEMTS", HRL Laboratories, LLC. (2002).

Buttari et al. "Digital Etching for High Reproducible low Damage Gate Recessing on AlGaN/GaN HEMTs" Proc. IEEE Lester Eastman Conf., Aug. 6-8, 2002, pp. 461-469.

Buttari, et al. "Selective Dry Etching of GaN in BCL3/SF6 Mixtures", Proceedings. IEEE Lester Eastman Conference, High Performance Devices, Aug. 2004, p. 132-137.

David Keough, et al. "Digital Etching of III-N Materials Using a Two-Step Ar/KOH Technique", Journal of Electronic Materials, 2006, vol. 35, No. 4, p. 771-776.

G. Parish, et al. "Simple Wet Etching of GaN", Proceedings of SPIE, Device and Process Technologies for MEMS and Microelectronics II, 2001, vol. 4592, p. 104-110.

Gregory C. Desalvo, et al., Wet Chemical Digital Etching of GaAs at Room Temperature, Journal of the Electrochemical Society, 1996, vol. 143, No. 11, p. 3652-3656.

H. Maher, et al., Smooth wet etching by ultraviolet-assisted photoetching and its application to the fabrication of AlGaN/GaN heterostructure field-effect transistors:, Applied Physics Letters, Dec. 2000, vol. 77, No. 23, p. 3833-3835.

Okamoto et al. "179 W recessed-gate AlGaN/GaN heterojunction FET with field-modulating plate" Electronics Letters, May 13, 2004, vol. 40, No. 10.

Shawn D. Burnham, et al. "Gate-recessed normally-off GaN0on-Si HEMT using a new O2-BCl3 digital etching technique", Physica Status Solidi C, (ICNS-8), 2010, vol. 7, No. 7-8, p. 2010-2012.

W.B. Lanford, et al., "Recessed-gate enhancement-mode GaN HEMT with high threshold voltage", Electronics Letters, Mar. 2005, vol. 41, No. 7, p. 449-450.

ISR and WO for related PCT/US2012/043114 mailed on Dec. 26, 2012.

The PCT International Preliminary Report on Patentability mailed on Jul. 3, 2013 of the corresponding PCT application No. PCT/US2012/043114 (7 pages).

From: U.S. Appl. No. 14/041,667, filed on Sep. 30, 2013, Application and Office Actions.

From: U.S. Appl. No. 12/909,497 (now U.S. Patent No. 8,124,505), Application and Office Actions including but not limited to the Office Actions mailed on May 31, 2011, Oct. 24, 2011, and Nov. 10, 2011.

PCT Chapter II International Preliminary Report on Patentability mailed in Jul. 3, 2013 from PCT/US2012/043114.

ISR/WO for related PCT/US2013/062750 mailed on Jun. 26, 2014.

Harris H. et al., "Plasma Enhanced Metalorganic Chemical Vapor Deposition of Amorphous Aluminum Nitrade," Journal of Applied Physics, American Institute of Physics, US, vol. 90, No. 11, Dec. 1, 2011, pp. 5825-5831.

EPO Extended Search Report with Search Opinion dated Mar. 6, 2015 from European Patent Application No. 12819630.0.

* cited by examiner

Fig. 3 Id (Ig) versus Vg at Vd=5V (Y-axis is in linear scale)

III-NITRIDE METAL-INSULATOR-SEMICONDUCTOR FIELD-EFFECT TRANSISTOR

CROSS REFERENCE TO RELATED APPLICATIONS

This application claims priority from U.S. Provisional Application No. 61/513,426, filed Jul. 29, 2011, and is a divisional application of U.S. patent application Ser. No. 13/456,039, filed on Apr. 25, 2012, which are incorporated herein by reference as though set forth in full. This application is related to U.S. patent application Ser. No. 12/909,497, filed Oct. 21, 2010, which issued as U.S. Pat. No. 8,124,505 on Feb. 28, 2012.

TECHNICAL FIELD

This disclosure relates to III-Nitride field effect transistors (FETs) and in particular to device structures and methods for fabricating metal insulator semiconductor field effect transistors.

BACKGROUND

Due to the excellent material properties of GaN, transistors made of GaN are suitable for high voltage, high temperature and fast operation. One key application of GaN transistors is to make switching devices that can manage the electric power flow. For power switch applications, it is highly desirable to use transistors working in normally-off mode. In order to enable normally-off operation, it is imperative to have a gate dielectric which can allow a positive bias on the gate without having a trapping or leakage problem.

Gate dielectrics that are common in the prior art include silicon oxide ($SiO_2$), silicon nitride (SiN), and aluminum oxide ($Al_2O_3$). While these dielectrics are good candidates for blocking leakage current, there are normally a high density of interface trap states between the III-Nitride semiconductors and the gate insulator. These trap states may cause an undesired threshold voltage shift. They may also provide an additional leakage path between the source and the drain.

The use of an AlN dielectric as a gate insulator is described by T. Hashizume, E. Alekseev, D. Pavlidis, K. Boutros, and J. Redwing, "Capacitance-Voltage Characterization of AlN/GaN Metal-Insulator-Semiconductor Structures Grown on Sapphire Substrate by Metalorganic Chemical Vapor Deposition," Journal of Applied Physics, vol. 88, no. 4, pp. 1983-1986, August 2000, and T. Chen, G. Jiao, Z. Li, F. Li, K. Shao, and N. Yang, "AlGaN/GaN MIS HEMT with ALD Dielectric," Digest of CS MANTECh Conference, pp. 227-230, April 2006.

The disadvantage of a gate insulator or dielectric formed of AlN as described by these references is that the forward gate leakage is still high, and is typically greater than 10 μA/mm at 3V of forward gate bias.

S. D. Burnham, K. Boutros, P. Hashimoto, C. Butler, D. W. S. Wong, M. Hu, and M. Micovic, "Gate-recessed Normally-off GaN-on-Si HEMT using a new $O_2/BCl_3$ Digital Etching Technique," at ICNS-8 Jeju, Korea, 2009, and U.S. patent application Ser. No. 12/909,497, filed on Oct. 21, 2010, describe methods of performing a gate recess etch with precise depth control and good uniformity.

Having a gate dielectric with low interface trap density and low leakage is a long-felt need for GaN devices. Researchers have tried different dielectrics for gate insulators in III-Nitride semiconductors. As discussed above, in spite of many years of research, there is little success of having low interface trap density, indicated by threshold voltage hysteresis, maximum drain current density, and off-state drain leakage current, and low gate leakage current at the same time, especially for normally-off transistors.

What is needed is a gate insulator that forms a good interface with III-Nitride semiconductors and which has a low interface trap density and a very low leakage current. Also desirable is a threshold voltage greater than 3V, a threshold voltage hysteresis less than 0.3V, gate leakage current density less than 10 μA/mm, off-state drain leakage current density less than 10 μA/mm, and maximum drain current density greater than 150 mA/mm. The embodiments of the present disclosure answer these and other needs.

SUMMARY

In a first embodiment disclosed herein, a field effect transistor (FET) comprises a III-Nitride channel layer, a III-Nitride barrier layer on the channel layer, wherein the barrier layer has an energy bandgap greater than the channel layer, a source electrode electrically coupled to one of the III-Nitride layers, a drain electrode electrically coupled to one of the III-Nitride layers, a gate insulator layer stack for electrically insulating a gate electrode from the barrier layer and the channel layer, the gate insulator layer stack including an insulator layer, such as SiN, and an AlN layer, the gate electrode in a region between the source electrode and the drain electrode and in contact with the insulator layer, and wherein the AlN layer is in contact with one of the III-Nitride layers.

In another embodiment disclosed herein, a method of fabricating a field effect transistor comprises forming a III-Nitride channel layer above a substrate, forming a III-Nitride barrier layer on the channel layer, wherein the barrier layer has an energy bandgap greater than the channel layer, forming a source electrode electrically coupled to one of the III-Nitride layers, forming a drain electrode electrically coupled to one of the III-Nitride layers, forming a gate insulator layer stack for electrically insulating a gate electrode from the barrier layer and the channel layer, the gate insulator layer stack comprising an insulator layer, such as SiN, and an AlN layer, and forming a gate electrode on the insulator layer in a region between the source electrode and the drain electrode, wherein the AlN layer is in contact with one of the III-Nitride layers.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
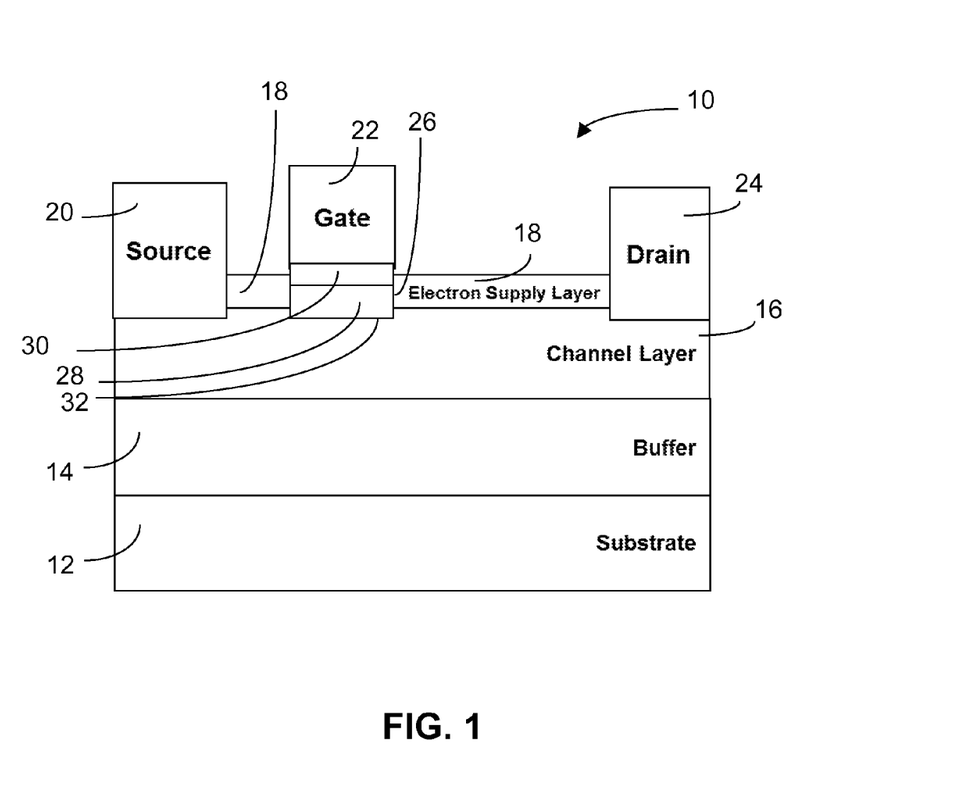
FIG. 1 shows an elevation sectional view of a device structure for a FET in accordance with the present disclosure.

FIG. 1 shows an elevation sectional view of a device structure for a FET 10 in accordance with the present disclosure. The FET has a buffer layer 14 formed on a substrate 12. A channel layer 16 is formed on the buffer layer 14 and an electron supply layer 18, which may also be called a barrier layer, is formed on the channel layer 16.

The substrate 12 material may be silicon (Si), silicon carbide (SiC), sapphire, gallium nitride (GaN), or aluminum nitride (AlN).

The buffer layer 14 may be a stack of III-Nitride materials grown on the substrate 12 by chemical vapor deposition or molecular beam epitaxy.

The channel layer 16 is a III-Nitride material grown on the buffer layer 14 by chemical vapor deposition or molecular beam epitaxy. Typically the channel layer 16 is an undoped GaN layer with the thickness ranging from 5 nanometers to a few micrometers.

The electron supply layer 18, also known as the barrier layer, may be a stack of III-Nitride materials grown on the channel layer by chemical vapor deposition or molecular beam epitaxy. The electron supply layer 18 is a III-Nitride material which has a greater energy bandgap than the channel layer 16. Typically the electron supply layer 18 may be a AlGaN alloy with an Al content of approximately 10-30% and a thickness of 5-50 nanometers (nm).

Without an external bias, mobile electrons accumulate at the interface between the electron supply layer 18 and the channel layer 16, due to the polarization effect.

The source electrode 20 and the drain electrode 24 are composed of metal and are in contact with the III-Nitride layers. The source 20 and drain 24 electrodes are typically formed by alloying a stack of titanium, aluminum, nitride, and gold (Ti/Al/Ni/Au), to make electrical contact to the mobile electrons.

A gate trench 26 may be formed by etching into the electron supply layer 18, and possibly into the channel layer 16. The etching may be performed by plasma etching. The gate trench 26 decreases the electron density under the gate trench 26. The bottom 32 of the gate trench 26 may be located within the electron supply layer 18, or the bottom 32 of the gate trench 26 may be in the channel layer 16, as shown in FIG. 1.

A gate insulator layer stack, which may also be known as a gate dielectric, is grown within the gate trench 26. The gate insulator may also cover the surface of the electron supply layer 18.

The gate insulator layer stack has at least an AlN based layer disposed directly on or in a layer of the FET to form an insulator for the gate electrode 22 from the barrier and channel layers with very low density of interface states, and a layer of SiN or other insulating material on top of the AlN-based layer to block leakage current.

As shown in FIG. 1, the gate insulator layer stack may consist of at least one aluminum nitride (AlN) layer 28 at the bottom of the insulating layer stack, and on top of the AlN layer 28 at least one silicon nitride (SiN) layer 30. The thickness of the AlN layer 28 may be in the range of 1-50 nm thick, and the thickness of the SiN layer 30 may also be in the range of 1-50 nm thick. The gate insulating layer stack fills the gate trench 26 and extends above the surface of the electron supply layer 18. The bottom 32 of the AlN layer 28 is in direct contact with either the electron supply layer 18 or, if the gate trench extends into the channel layer 16, the channel layer 16.

In some embodiments such as normally-on transistors, it is not necessary to form a gate trench. In these embodiments the gate insulator layer stack is formed on top of the electron supply layer 18, also known as the barrier layer.

The AlN layer 28 may be a single crystalline material, an amorphous material, or a poly-crystalline material. Typically the AlN layer 28 may be an amorphous material.

The AlN layer 28 and the SiN layer 30 may be grown using chemical vapor deposition (CVD) using a CVD reactor with the growth temperature higher than 300 degrees centigrade. In an embodiment where the AlN layer 28 is an amorphous material, or a poly-crystalline material, the AlN layer 28 may be grown at a temperature less than 800 degrees centigrade by metal-organic chemical vapor deposition (CVD).

A gate electrode 22 is formed on top of the insulating layer stack of the AlN layer 28 and the SiN layer 30. As shown in FIG. 1, the gate electrode 22 is formed on top of the SiN layer 30. The gate electrode 22 may be a formed of metal, such as gold (Au), or be formed of a stack of metals, such as a stack of nickel/gold (Ni/Au).

The source electrode 20 and the drain electrode 24 are formed on opposite sides of the gate trench 26, and have an electrical contact to mobile electrons in the channel layer 16.

As discussed above, gate dielectrics that are common in the prior art include silicon oxide ($SiO_2$), silicon nitride (SiN), and aluminum oxide ($Al_2O_3$). While these dielectrics are good candidates for blocking leakage current, there are normally a high density of interface trap states between the III-Nitride semiconductors and the gate insulator. These trap states may cause an undesired threshold voltage shift. They may also provide an additional leakage path between the source and the drain.

Field effect transistors fabricated in accordance with the present disclosure with a gate dielectric being a gate insulator layer stack have an AlN insulator layer 28 to form a good interface with III-Nitride semiconductors and a SiN insulator layer 30 to effectively block leakage current. Normally-off III-Nitride field-effect transistors with this gate dielectric stack provide the following characteristics: a threshold voltage greater than 1 volt (V); a threshold voltage hysteresis less than 0.5V; a gate leakage current density less than 10 μA/mm within the gate bias range of −5V to +5V; an off-state drain leakage current density less than 10 μA/mm at a gate bias of 0V; and a maximum drain current density greater than 150 mA/mm.

Figure 2:
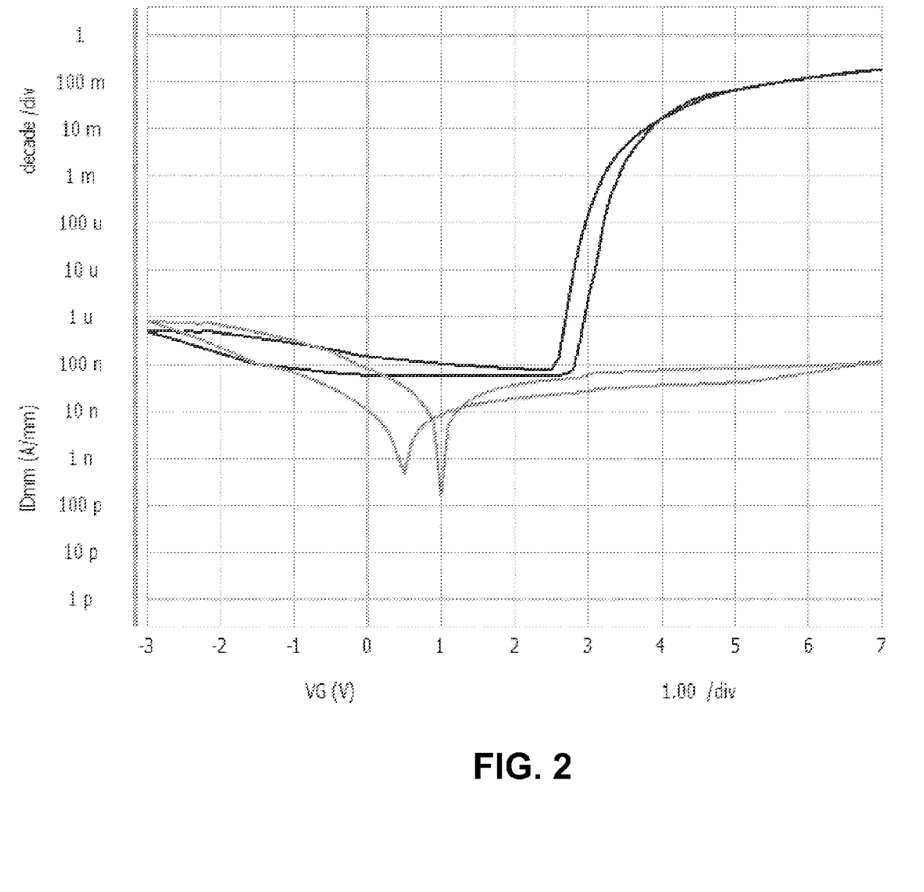
FIG. 2 shows Id (Ig) on a log scale versus Vg characteristics of a FET fabricated in accordance with the present disclosure.
Figure 3:
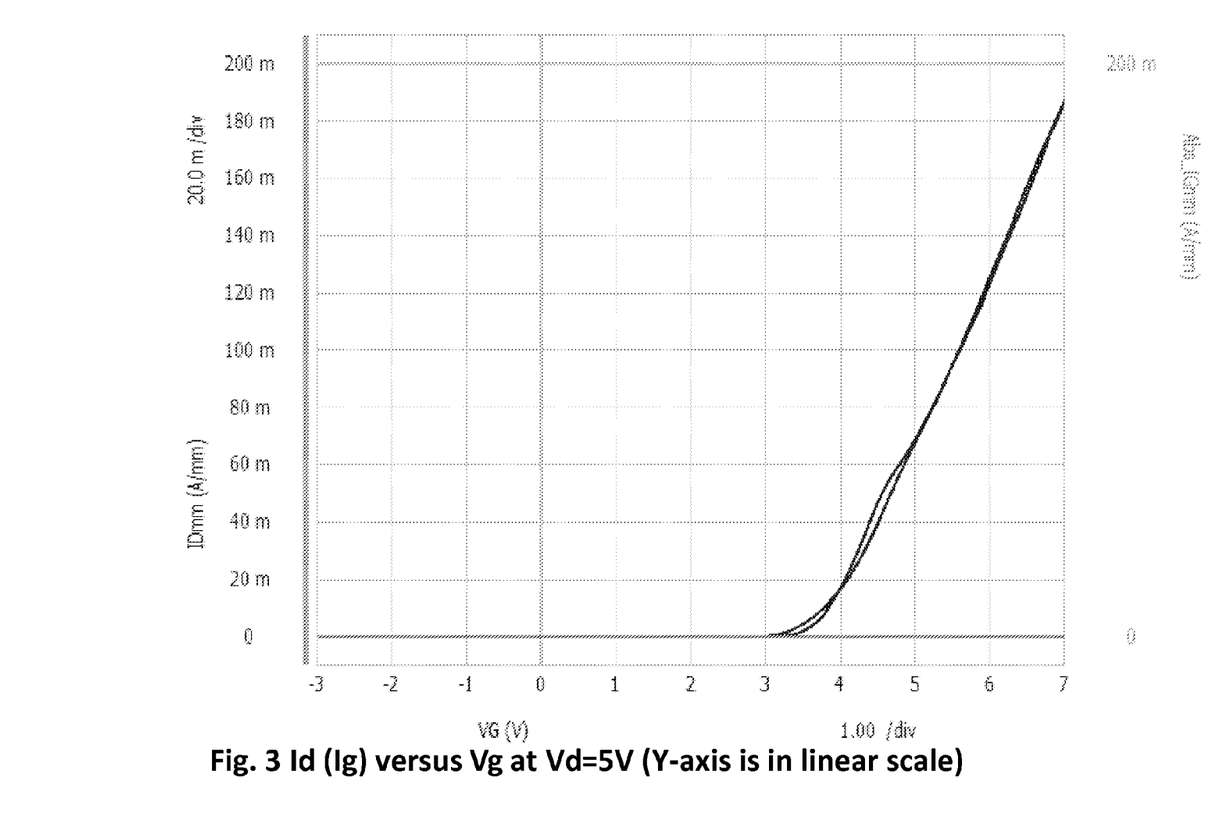
FIG. 3 shows Id (Ig) on a linear scale versus Vg characteristics of a FET fabricated in accordance with the present disclosure.

FIG. 2 shows a log scale Id (Ig) versus Vg characteristic of a FET made according to the present disclosure. FIG. 3 shows a linear scale Id (Ig) versus Vg characteristic of a FET made according to the present disclosure. A high positive threshold of about 3V may be observed, indicating that the gate insulator stack of the AlN layer 28 and the SiN layer 30 did not add significant fixed charge. The hysteresis between positive and negative sweep may also be seen to be very low, which indicates a low density of trap states. The gate current is low within the whole gate bias range, indicating an efficient blockage of leakage current by the gate insulator stack of the AlN layer 28 and the SiN layer 30.

Figure 4:
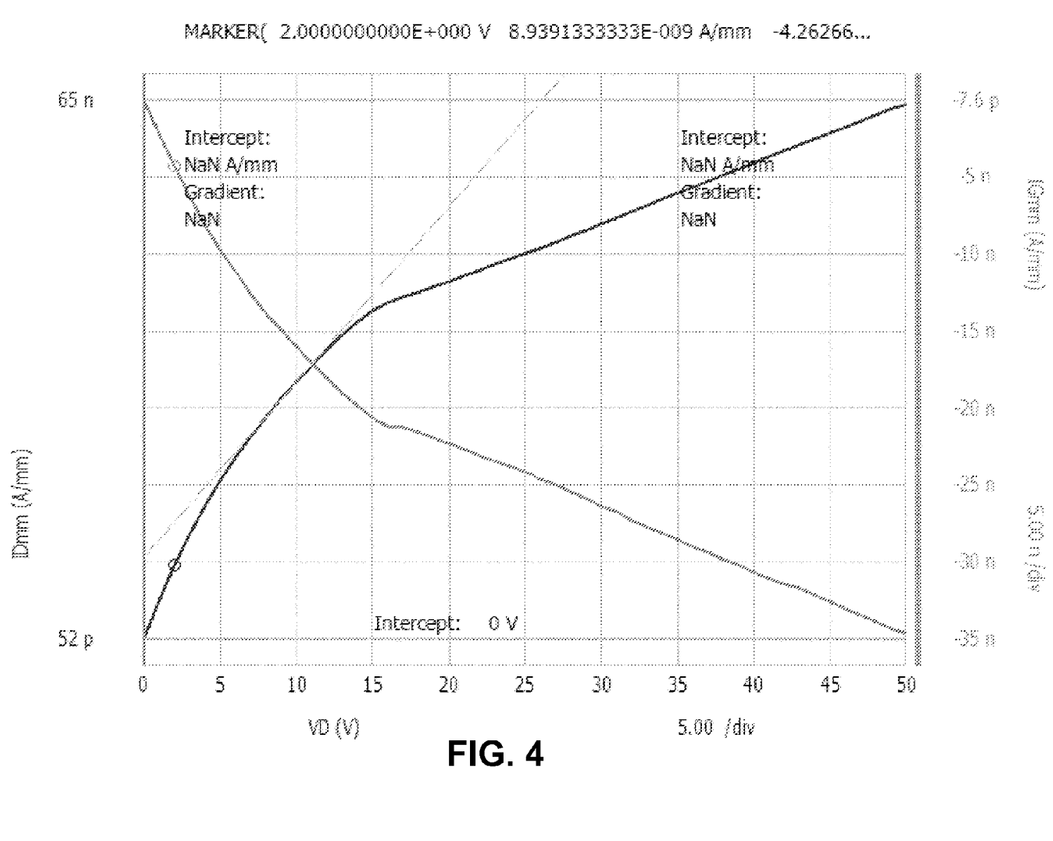
FIG. 4 shows off-state leakage current as a function of drain bias measured at a fixed gate bias of OV for a FET fabricated in accordance with the present disclosure.

FIG. 4 shows off-state leakage current as a function of drain bias measured at a fixed gate bias of 0V. The drain/gate leakage is as low as 65/35 nA/mm up to a drain bias of 50V, which indicates an extremely low electron conduction through the gate insulator stack of the AlN layer 28 and the SiN layer 30 to the electron supply layer 18 or the channel layer 16.

Figure 5:
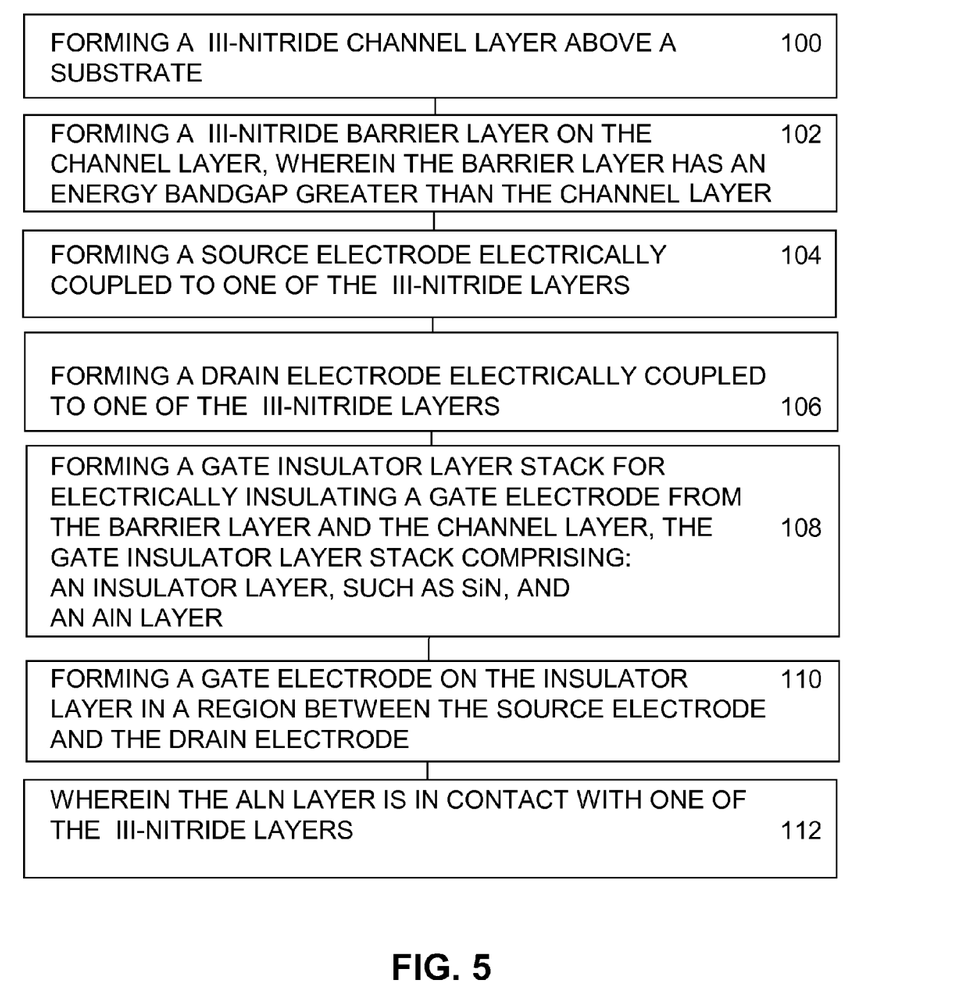
FIGS. 5 and 6 are flow diagram of methods of fabricating a FET in accordance with the present disclosure.
Figure 6:
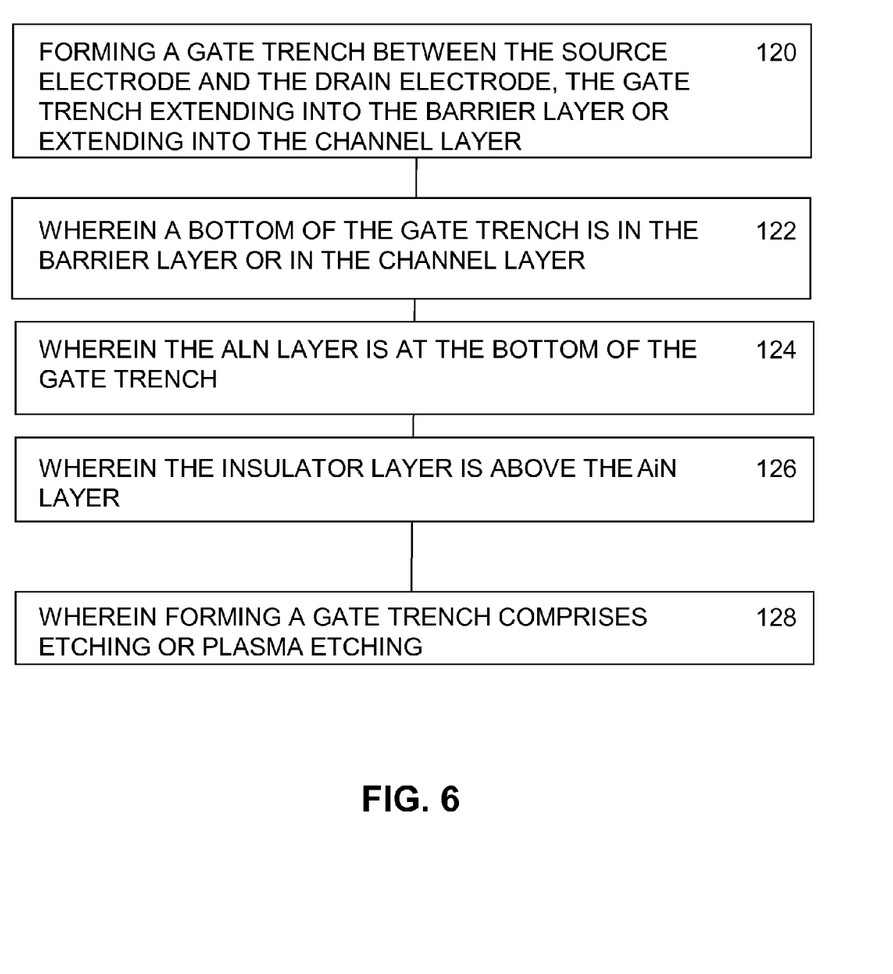

FIGS. 5 and 6 are flow diagram of methods of fabricating a FET in accordance with the present disclosure.

Referring to the method shown in FIG. 5, in step 100 a III-Nitride channel layer is formed above a substrate. Then in step 102 a III-Nitride barrier layer is formed on the channel layer and the barrier layer has an energy bandgap greater than the channel layer. Next in step 104 a source electrode is electrically coupled to one of the III-Nitride layers. Then in step 106 a drain electrode is electrically coupled to one of the III-Nitride layers. Next is step 108 a gate insulator layer stack is formed for electrically insulating a gate electrode from the barrier layer and the channel layer. The gate insulator layer stack includes an insulator layer, such as SiN, and an AlN layer. Then in step 110 a gate electrode is formed on the insulator layer in a region between the source electrode and the drain electrode. As shown in step 112 the AlN layer is in contact with one of the III-Nitride layers.

Referring now to FIG. 6, a method for fabricating a FET in accordance with the present description includes forming in step 120 a gate trench between the source electrode and the drain electrode, the gate trench extending into the barrier layer or extending into the channel layer. As shown: in step 122 a bottom of the gate trench is in the barrier layer or in the channel layer; in step 124 the AlN layer is at the bottom of the gate trench; and in step 126 the insulator layer is above the AlN layer. The gate trench may be formed by etching or plasma etching as shown in step 128.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of fabricating a field effect transistor (FET) comprising:
   forming a III-Nitride channel layer above a substrate;
   forming a III-Nitride barrier layer on the channel layer, wherein the barrier layer has an energy bandgap greater than the channel layer;
   forming a source electrode electrically coupled to one of the III-Nitride layers;
   forming a drain electrode electrically coupled to one of the III-Nitride layers;
   forming a gate insulator layer stack for electrically insulating a gate electrode from the barrier layer and the channel layer, the gate insulator layer stack comprising:
      an insulator layer; and
      an AlN layer; and
   forming a gate electrode on the insulator layer in a region between the source electrode and the drain electrode;
   wherein the AlN layer is in contact with one of the III-Nitride layers;
   wherein the AlN layer has a thickness ranging from 1.5 nanometers to 50 nanometers.

2. The method of claim 1 wherein:
   the insulator layer is 1-50 nanometers thick.

3. The method of claim 1 further comprising:
   forming a gate trench between the source electrode and the drain electrode, the gate trench extending into the barrier layer or extending into the channel layer;
   wherein a bottom of the gate trench is in the barrier layer or in the channel layer;
   wherein the AlN layer is at the bottom of the gate trench; and
   wherein the insulator layer is above the AlN layer.

4. The method of claim 3 wherein forming a gate trench comprises etching or plasma etching.

5. The method of claim 1 wherein:
   the AlN layer is formed on the barrier layer; and
   the insulator layer is formed above the AlN layer.

6. The method of claim 1 further comprising:
   providing a substrate comprising silicon (Si), silicon carbide (SiC), sapphire, gallium nitride (GaN), or aluminum nitride (AlN); and
   forming a buffer layer between the substrate and the channel layer.

7. The method of claim 1 wherein the AlN layer is formed of a single crystalline material, an amorphous material, or a poly-crystalline material.

8. The method of claim 1 wherein forming the gate insulator layer stack comprises:
   growing the AlN layer and the insulator layer using chemical vapor deposition (CVD) with a growth temperature higher than 300 degrees centigrade.

9. The method of claim 1 wherein forming the gate insulator layer stack comprises:
   growing the AlN layer at a temperature less than 800 degrees centigrade by metal-organic chemical vapor deposition (CVD);
   wherein the AlN layer is an amorphous material, or a poly-crystalline material.

10. The method of claim 1 wherein:
    forming a III-Nitride channel layer comprises:
       growing the channel layer using chemical vapor deposition or molecular beam epitaxy;

wherein the channel layer has a thickness of 5 nanometers to 3 micrometers; and forming a III-barrier layer comprises:
growing the barrier layer using chemical vapor deposition or molecular beam epitaxy;
wherein the barrier layer has a thickness of 5 nanometers to 50 nanometers.

11. The method of claim 1 wherein the insulator comprises SiN.

12. The method of claim 1 wherein the insulator layer extends above the barrier layer.

* * * * *